United States Patent [19]

Hickernell et al.

[11] Patent Number: 5,434,466
[45] Date of Patent: Jul. 18, 1995

[54] ACOUSTIC WAVE FILTER WITH REDUCED BULK-WAVE SCATTERING LOSS AND METHOD

[75] Inventors: Thomas S. Hickernell, Mesa; David Penunuri, Fountain Hills, both of Ariz.

[73] Assignee: Motorola, Inc., Schaumburg, Ill.

[21] Appl. No.: 251,159

[22] Filed: May 31, 1994

[51] Int. Cl.⁶ .......................................... H01L 41/08
[52] U.S. Cl. .......................... 310/313 D; 310/313 B; 333/195
[58] Field of Search ........... 310/313 R, 313 B, 313 D; 333/150–155, 193–196

[56] References Cited

U.S. PATENT DOCUMENTS

| | | | |
|---|---|---|---|
| 3,886,504 | 5/1975 | Hartmann et al. | 310/313 D X |
| 4,065,735 | 12/1977 | Palfreeman et al. | 310/313 D X |
| 4,072,915 | 2/1978 | Mitchell | 310/313 D |
| 4,625,208 | 11/1986 | Skeie et al. | 310/313 D X |
| 4,635,009 | 1/1987 | Ebata | 310/313 D X |
| 4,760,360 | 7/1988 | Grassl et al. | 333/195 |
| 4,965,479 | 10/1990 | Elliott et al. | 310/313 D |
| 5,130,597 | 7/1992 | Mariani | 310/313 D |
| 5,351,022 | 9/1994 | Ruile et al. | 333/195 |

OTHER PUBLICATIONS

"A Fast Green's Function Method For Calculating Bulk Wave Frequency Responses From Saw Frequency Responses" by K. C. Wagner and O. Manner of Siemens Ag, Central Research Laboratories, Munich, Germany and Siemens AG Austria, ETG 323, Vienna Austria, from IEEE 1990 Ultrasonics Symposium—411.

*Primary Examiner*—Mark O. Budd
*Attorney, Agent, or Firm*—Frederick M. Fliegel

[57] ABSTRACT

An acoustic wave filter with reduced bulk-wave scattering loss has a center frequency and an associated acoustic wavelength. The filter includes a substrate and a first reflector having a first group of periodically disposed reflective elements. The filter includes a first transducer on a first side of the first reflector. The filter also includes a first gap having a first width, located between the first reflector and the first transducer. The first width exceeds one-fourth of the acoustic wavelength. The filter includes a second reflector and a second gap disposed between the first transducer and the second reflector. The second gap has a second breadth exceeding one-fourth of the acoustic wavelength. A first waveguiding element is positioned within the first gap and having a first breadth. The first width exceeds the first breadth.

20 Claims, 2 Drawing Sheets

ACOUSTIC WAVE FILTER WITH REDUCED BULK-WAVE SCATTERING LOSS AND METHOD

FIELD OF THE INVENTION

This invention relates in general to surface acoustic wave filters, in particular to leaky surface wave/surface skimming bulk wave filters and more particularly to acoustic filters fabricated with high electromechanical coupling coefficient substrates.

BACKGROUND OF THE INVENTION

Acoustic wave filters employ generally periodic arrays of electrodes configured to provide discrete elements such as transducers (for converting electrical to mechanical energy and vice versa), reflectors (for reversing the direction of propagation of an acoustic wave) and gratings (e.g., for separating transducers and/or resonant cavities and/or providing electrical isolation therebetween). These elements are grouped in a generally in-line configuration (e.g., reflector, transducer, grating, transducer, reflector) and are separated by inter-element gaps, with the entire array providing an electrical filtering function associated with the electrical port(s) of the transducer(s). The relative widths of the inter-element gaps affect: the electrical and acoustic performance of the composite filter.

The desired electrical performance often dictates gap sizes representing deviations from the periodicities of the respective elements, providing surface boundary condition discontinuities and reflecting a portion of the incident acoustic wave and scattering another portion into bulk acoustic waves. Particularly on high electromechanical coupling coefficient substrates, surface boundary condition discontinuities lead to bandwidth perturbations, increased in-band (i.e., passband) insertion loss and decreased out-of-band (i.e., stop-band) signal rejection.

What is needed is an apparatus and a method for making acoustic wave filters having electrical performance characteristics that are less degraded by bulk scattering losses even when implemented on high coupling coefficient substrates.

DETAILED DESCRIPTION OF THE DRAWING

Generally, the present invention provides a method and apparatus for reducing bulk-acoustic-wave losses and related effects in acoustic wave (e.g., SAW, surface skimming bulk wave, leaky wave etc.) type filters fabricated on high electrical coupling coefficient substrates. This may be accomplished by reducing the number and/or magnitude of surface boundary condition discontinuities contained within the filter structure while preserving geometries that provide the desired transfer function. These effects may be calculated using suitable modeling tools such as Green's function methods as described in "A Fast Green's Function Method For Calculating Bulk Wave Frequency Responses From SAW Frequency Responses" by K. C. Wagner and O. Manner, 1990 IEEE Ultrasonics Symposium Proceedings, pp. 411–415.

Figure 1:
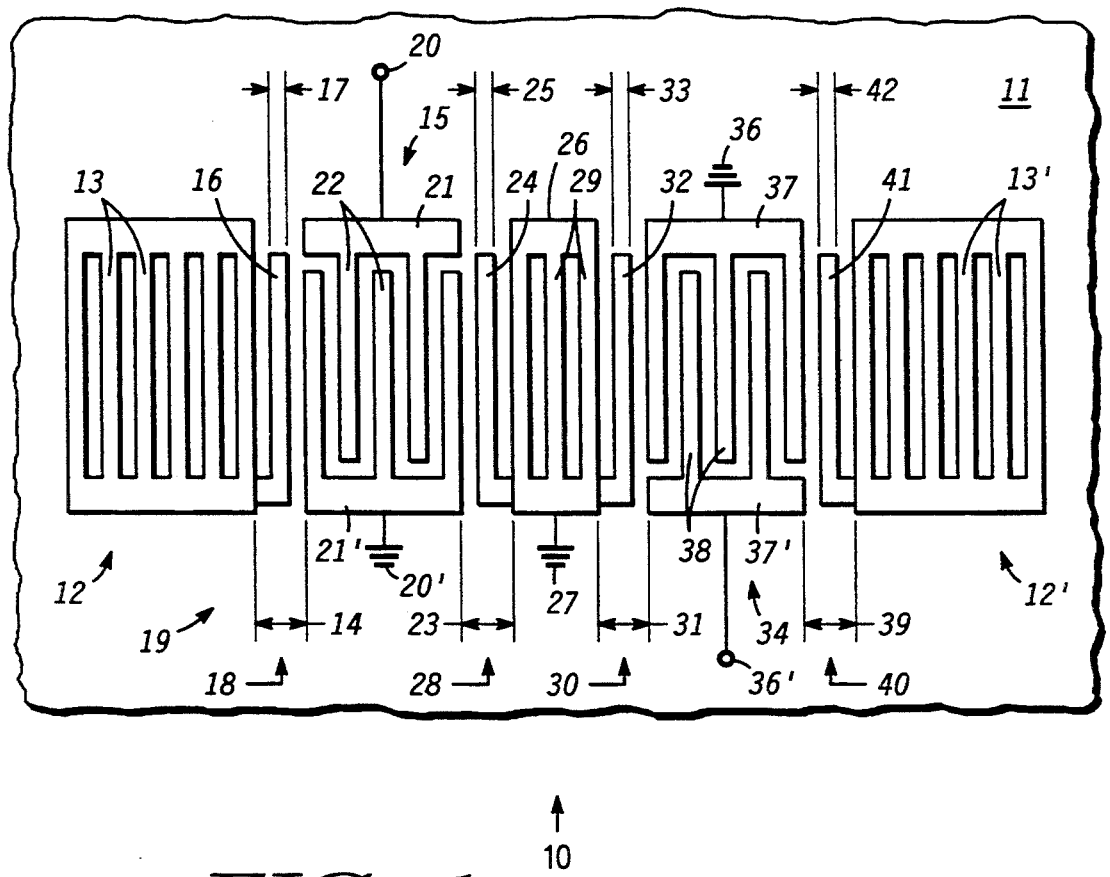
FIG. 1 is a plan view of an acoustic wave filter in accordance with the present invention.
Figure 2:
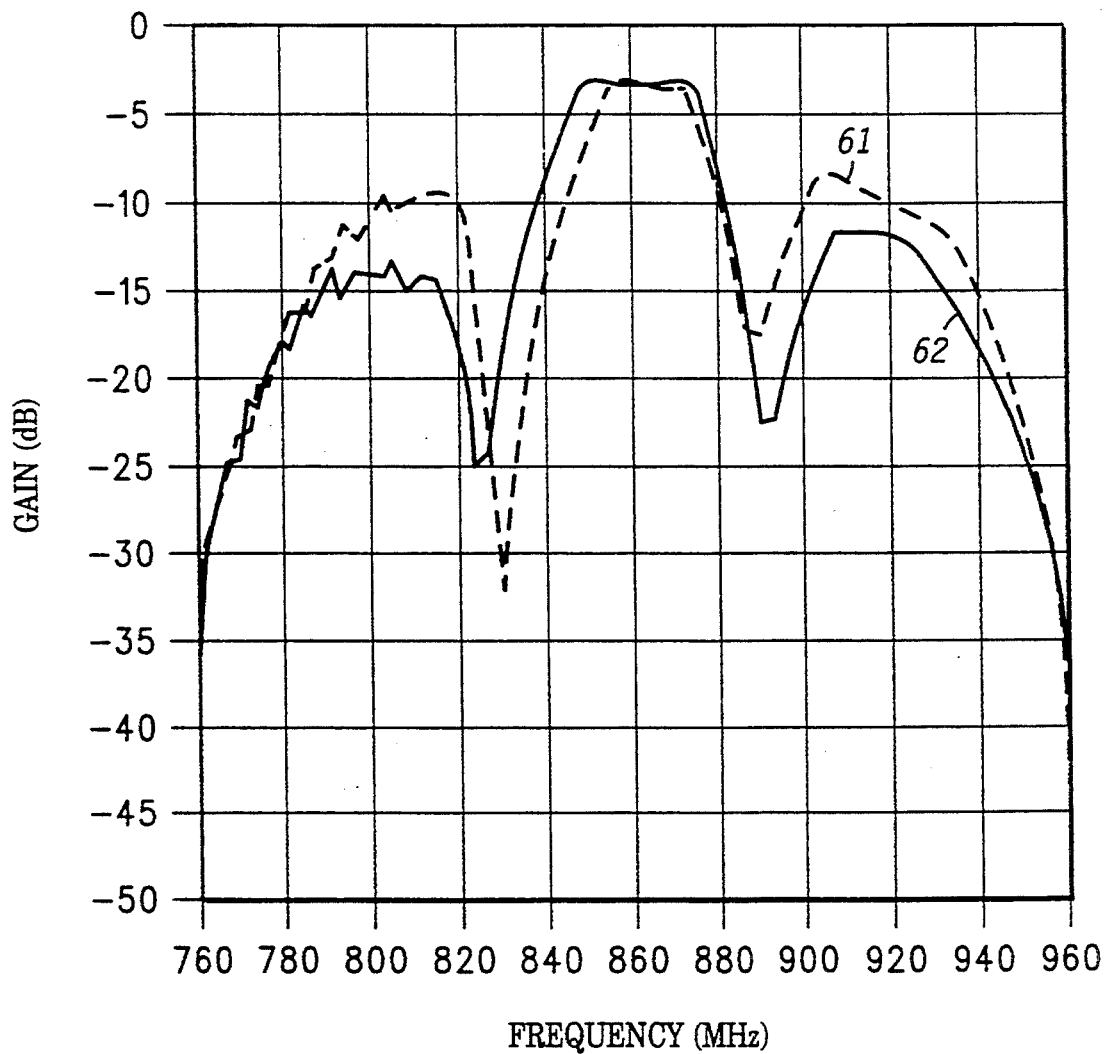
FIG. 2 graphically depicts filter responses showing some of the effects of including the structure of the present invention.

The present invention may be more fully understood with reference to FIGS. 1 and 2. FIG. 1 is a plan view of acoustic wave filter 10 in accordance with the present invention. FIG. 1 shows acoustic wave filter 10 comprising acoustic wave propagating substrate 11 having filter pattern 19 disposed thereon. Filter pattern 19 usefully comprises reflectors 12, 12', transducers 15, 34 and grating 26, separated by gaps 18, 28, 30, 40, all collectively disposed along a preferred axis of the substrate material and on a suitably-prepared surface thereof.

Filters of this type typically include at least two reflectors 12, 12', at least one transducer disposed between reflectors 12, 12', optional grating 26 (comprising electrodes 29) and gaps separating the transducer(s) from reflectors 12, 12' and optional grating 26. Electrical stimulation at an appropriate frequency supplied via interconnections 20, 20' or 36, 36' to bus bars 21, 21' or 37, 37' and thence to interleaved electrodes 22 or 38 results in acoustic waves being generated within transducer 15 or 34. Similarly, acoustic waves of an appropriate frequency impinging upon electrodes 22 or 38 result in electrical signals being manifested at interconnections 20, 20' or 36, 36'. As used herein, the term "acoustic wavelength" is taken to mean an acoustic wavelength at the filter center frequency, i.e., in the nominal center of the filter passband.

Each transducer 15, 34 comprises a series of periodically disposed electrodes 22, 38, often one-fourth of an acoustic wavelength in width, disposed on one-half acoustic wavelength centers, usually alternately coupled to their associated bus bars 21, 21' or 37, 37', respectively, although other arrangements are possible and useful.

FIG. 1 illustrates gaps 18, 28, 30, 40 having widths 14, 23, 31, 39, respectively, each width usefully greater than one-eighth of the acoustic wavelength, desirably greater than one-fourth of the acoustic wavelength and preferably .greater than one-half of the acoustic wavelength. Gaps 18, 28, 30, 40 optionally include waveguiding elements 16, 24, 32, 41 disposed therein, respectively, and having breadths 17, 25, 33, 42, respectively. Waveguiding elements such as 16, 24, 32, 41 may favorably affect the insertion loss, bandwidth, out-of-band signal rejection, selectivity, bandshape and electrical impedance of filter 10 by reducing scattering and reflections occurring at acoustic surface boundary condition discontinuities such as those associated with gaps 18, 228, 30, 40. Such surface boundary condition discontinuities are particularly pronounced when gaps 18, 18, 28, 30, 40 exceed one-half of the acoustic wavelength in width. Higher electromechanical coupling coefficient materials exacerbate reflections and/or scattering because the boundary condition changes provided by gaps (e.g., gaps 18, 28, 30, 40) are more profound in these materials.

Filters such as that illustrated in FIG. 1 may be constructed on suitably-prepared substrates such as 41° $LiNbO_3$, 64° $LiNbO_3$ and 36° $LiTaO_3$. Filter pattern 19 is typically fabricated by depositing and patterning a thin metal film, often comprising aluminum in a thickness ranging from tens to hundreds of nanometers thick, by techniques similar to those employed in integrated circuit manufacturing.

The present invention is especially useful when low insertion loss is required together with wide passband width, for which higher electromechanical coupling coefficient substrates are particularly well suited. These materials also give rise to increased susceptibility to scattering of acoustic energy into the depth of the substrate, which is especially pronounced for discontinuities in the electrical boundary conditions existing at the substrate surface in the transducer patterns (i.e., at gaps 18, 28, 30, 40), particularly when gaps 18, 28, 30, 40 exceed one-half of the acoustic wavelength in width.

Breadths 17, 25, 33, 42 are usefully in the range of from one-twentieth to one-half of the acoustic wavelength, desirably in the range of from one-tenth to one-fifth of the acoustic wavelength and preferably in the range of from one-eighth to one-sixth (or about 0.15) of the acoustic wavelength. Waveguiding elements 16, 24, 32, 41 are typically aperiodic with reflection elements 13, 13' and transducer electrodes 22, 38 because the widths of waveguiding elements 16, 24, 32, 41 differ from that of either reflection elements 13, 13' and/or transducer electrodes 22, 38 and further because waveguiding elements 16, 24, 32, 41 do not necessarily maintain the center-to-center separation of either reflection elements 13, 13' or transducer electrodes 22, 38. Inclusion of waveguiding elements 16, 24, 32, 41 within gaps having widths of greater than one-fourth and especially within gaps having widths greater than one-half of the acoustic wavelength decreases scattering of acoustic waves into the bulk of the substrate, reducing passband insertion loss while preserving bandwidth and other desired filter characteristics.

While waveguide elements 16, 41 are illustrated as being electrically coupled to reflectors 12, 12', waveguide elements 16, 41 may be electrically decoupled from either reflectors: 12, 12', transducers 15, 34 or both or may be electrically coupled to transducer 15 or 34 or may be electrically coupled to both a transducer 15 or 34 and a reflector 12 or 12'. Similarly, while waveguide elements 24, 32 are: illustrated as being electrically coupled to grating 26, waveguide elements 24 and/or 32 may be coupled to transducer 15 or 34, respectively, or may be electrically decoupled from either transducers 15, 34 and grating 26.

Typically, the designer of such a filter chooses gap widths for gaps disposed between the transducers and the reflectors to provide an approximation to a combination of passband insertion loss, out-of-band rejection characteristics and bandwidth and then adjusts the widths of gap(s) disposed between transducers 15, 34 and any grating 26 disposed between transducers 15, 34 to realize optimum bandwidth, insertion loss and other filter characteristics.

In another embodiment of the present invention, several such filters 10 may be cascaded to provide further performance enhancement. A first filter 10 has an electrical input (e.g., terminals 20, 20') and an output (e.g., terminals 36, 36'). A second filter 10 has an electrical input (e.g., terminals 20, 20') coupled to the electrical output of the first filter (i.e., terminals 36, 36') and the second filter then provides an output signal at the output terminals of the second filter (e.g., terminals 36, 36'). This configuration provides improved out-of-band signal rejection together with increased passband insertion loss. When the first and second filters are chosen to have slightly different parameters, nulls in the out-of-band characteristics of one filter may be placed at frequencies different from those of the nulls of the out-of-band characteristic of the other to provide improved out-of-band signal rejection.

EXAMPLE

FIG. 2 is a graph of measured frequency responses for two filters constructed on 41° LiNbO$_3$. Solid trace 62 corresponds to a filter built in accordance with the present invention (see FIG. 1) while dashed trace 61 corresponds to a similar filter lacking waveguiding elements 16, 24, 32, 41. In this example, gap breadths 14, 39 of 0.65 of the acoustic wavelength, gap breadths 23, of 0.5 of the acoustic wavelength, waveguide elements 16, 41 having breadths 17, 42 of one-fourth of the acoustic wavelength and waveguide elements 24, 32 having breadths 25, 33 of about 0.15 of the acoustic wavelength were employed. Both greater symmetry about the passband and increased passband bandwidth result from these choices, as may be appreciated by comparing solid trace 62 (with waveguide elements) to dashed trace 61 (without waveguide elements). Waveguide elements 16, 41 illustrate aperiodic placement of waveguide elements 16, 41 having breadths 17, 42 similar to those of reflector elements 13, 13' and/or transducer electrodes 22, 38 while waveguide elements 24, 32 exemplify both aperiodic placement and breadths 25, 33 distinct from those of electrodes 22, 38 and/or reflection elements 13, 13'.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An acoustic wave filter with reduced bulk-wave scattering loss, said acoustic wave filter having a center frequency and an acoustic wavelength associated with said center frequency, said acoustic wave filter comprising:

an acoustic wave propagating substrate;

a first reflector comprising a first group of reflective elements periodically disposed along a preferred axis on a first surface of said acoustic wave propagating substrate;

a first transducer disposed to a first side of said first reflector, said first transducer comprising a group of electrodes periodically disposed along said preferred axis on said first surface, said first transducer for providing acoustic waves traveling in either direction along said preferred axis in response to electrical stimulation and for providing electrical signals in response to acoustic waves incident on said first transducer;

a first gap having a first width, said first width exceeding one-fourth of said acoustic wavelength, said first gap disposed between said first reflector and said first transducer on said first surface;

a second reflector comprising a second group of reflective elements periodically disposed along said preferred axis on said first surface, said second reflector disposed to a side of said first transducer opposite said first reflector;

a second gap disposed on said first surface between said first transducer and said second reflector, said second gap having a second width;

a first waveguiding element positioned within said first gap and having a first breadth, said first width exceeding said first breadth;

a second transducer disposed between said first transducer and said second reflector; and a grating disposed between said first and second transducers, said grating comprising a series of periodically disposed electrodes, said grating separated from said first transducer by said second gap, said grating separated from said second transducer by a third gap having a third width, wherein said second transducer is separated from said second reflector by a fourth gap having a fourth width.

2. An acoustic wave filter having reduced bulk-wave scattering loss and having a center frequency and an acoustic wavelength associated with said center frequency, said acoustic wave filter comprising:

an acoustic wave propagating substrate;

a first reflector comprising a first group of reflective elements periodically disposed along a preferred axis on a first surface of said acoustic wave propagating substrate;

a first transducer disposed to a first side of said first reflector, said first transducer comprising a first group of electrodes periodically disposed along said preferred axis on said first surface, said first transducer for providing acoustic waves traveling in either direction along said preferred axis in response to electrical stimulation and for providing electrical signals in response to acoustic waves incident on said first transducer;

a first gap having a first width exceeding one-fourth of said acoustic wavelength, said first gap disposed between said first reflector and said first transducer on said first surface;

a second reflector comprising a second group of reflective elements periodically disposed along said preferred axis on said first surface, said second reflector disposed to a side of said first transducer opposite said first reflector;

a first waveguiding element positioned within said first gap and having a first breadth, said first width exceeding said first breadth;

a second transducer disposed between said first transducer and said second reflector, said second transducer comprising a second group of electrodes periodically disposed along said preferred axis on said first surface;

a grating disposed between said first and second transducers, said grating comprising a series of periodically disposed electrodes, said grating separated from said first transducer by a second gap having a second breadth, said grating separated from said second transducer by a third gap having a third width, said second transducer separated from said second reflector by a fourth gap having a fourth width;

a second waveguiding element positioned within said second gap and having a second breadth, said second width exceeding said second breadth;

a third waveguiding element positioned within said third gap and having a third breadth, said third width exceeding said third breadth; and a fourth waveguiding element positioned within said fourth gap and having a fourth breadth, said fourth width exceeding said fourth breadth.

3. A filter as claimed in claim 1, wherein said first waveguiding element is aperiodic with respect to said first group of reflective elements.

4. A filter as claimed in claim 1, wherein said first width exceeds one-eighth of said acoustic wavelength.

5. A filter as claimed in claim 1, wherein said first width exceeds one-fourth of said acoustic wavelength.

6. A filter as claimed in claim 3, further including a second waveguiding element positioned within said second gap, said second waveguiding element having a second breadth, said second width exceeding said second breadth.

7. A filter as claimed in claim 6, wherein said second breadth is in the range from one-tenth to two-tenths of said acoustic wavelength.

8. A filter as claimed in claim 2, further including a third waveguiding element positioned within said third gap and having a third breadth, said third width exceeding said third breadth.

9. A filter as claimed in claim 8, wherein said third breadth is in a range of from one-tenth to two-tenths of said acoustic wavelength.

10. A filter as claimed in claim 2, further including a fourth waveguiding element positioned within said fourth gap and having a fourth breadth, said fourth width exceeding said fourth breadth.

11. A filter as claimed in claim 2, further including:

a second waveguiding element positioned within said second gap and having a second breadth, said second width exceeding said second breadth;

a third waveguiding element positioned within said third gap and having a third breadth, said third width exceeding said third breadth; and a fourth waveguiding element positioned within said fourth gap and having a fourth breadth, said fourth width exceeding said fourth breadth.

12. A filter as claimed in claim 11, wherein each of said first, second, third and fourth widths exceed one-half of said acoustic wavelength.

13. A filter as claimed in claim 11, wherein each of said first, second, third and fourth breadths is in a range of from one-tenth to two-tenths of said acoustic wavelength.

14. A filter as claimed in claim 12, wherein each of said first, second, third and fourth breadths is in a range of from one-tenth to one-fourth of said acoustic wavelength.

15. A filter as claimed in claim 1, further comprising:

a second transducer disposed between said first transducer and said second reflector; and a grating disposed between said first and second transducers, said grating comprising a series of periodically disposed electrodes, said grating separated from said first transducer by said second gap, said grating separated from said second transducer by a third gap having a third width, wherein said second transducer is separated from said second reflector by a fourth gap having a fourth width.

16. A filter as claimed in claim 1, further including a second waveguiding element positioned within said second gap, said second waveguiding element having a second breadth, said second width exceeding said second breadth.

17. A filter as claimed in claim 16, wherein said second breadth is in the range from one-tenth to two-tenths of said acoustic wavelength.

18. A filter as claimed in claim 18, further including a third waveguiding element positioned within said third gap and having a third breadth, said third width exceeding said third breadth.

19. A filter as claimed in claim 18, wherein said third breadth is in a range of from one-tenth to two-tenths of said acoustic wavelength.

20. A filter as claimed in claim 1, further including a fourth waveguiding element positioned within said fourth gap and having a fourth breadth, said fourth width exceeding said fourth breadth.

* * * * *

UNITED STATES PATENT AND TRADEMARK OFFICE
CERTIFICATE OF CORRECTION

PATENT NO.   : 5,434,466
DATED        : July 18, 1995
INVENTOR(S)  : Thomas S. Hickernell et al.

It is certified that error appears in the above-indentified patent and that said Letters Patent is hereby corrected as shown below:

In column 6, lines 4-6, should be deleted and insert-- 3.
An acoustic wave filter with reduced bulk-wave scattering loss, said acoustic wave filter having a center frequency and an acoustic wavelength associated with said center frequency, said acoustic wave filter comprising:
    an acoustic wave propagating substrage;
    a first reflector comprising a first group of reflective elements periodically disposed along a preferred axis on a first surface of said acoustic wave propagating substrate;
    a first transducer disposed to a first side of said first reflector, said first transducer comprising a group of electrodes periodically disposed along said preferred axis on said first surface, said first transducer for providing acoustic waves traveling in either direction along said preferred axis in response to electrical stimulation and for providing electrical signals in response to acoustic waves incident on said first transducer;
    a first gap having a first width, said first width exceeding one-fourth of said acoustic wavelength, said first gap disposed between said first reflector and said first transducer on said first surface;
    a second reflector comprising a second group of reflective elements periodically disposed along said preferred axis on said first surface, said second reflector disposed to a side of said first transducer opposite said first reflector;
    a second gap disposed on said first surface between said first transducer and said second reflector, said second gap having a second width; and
    a first waveguiding element positioned within said first gap and having a first breadth, said first width exceeding said first breadth, wherein said first waveguiding element is aperiodic with respect to said first group of reflective elements.--

UNITED STATES PATENT AND TRADEMARK OFFICE
CERTIFICATE OF CORRECTION

PATENT NO. : 5,434,466
DATED : July 18, 1995
INVENTOR(S) : Thomas S. Hickernell et al.

It is certified that error appears in the above-indentified patent and that said Letters Patent is hereby corrected as shown below:

In column 6, line 7, replace "1" with --3--.

In column 6, line 9, replace "1" with --3--.

In column 6, line 19, replace "2" with --15--.

In column 6, line 26, replace "2" with --15--.

In column 6, line 30, replace "2" with --15--.

In column 6, line 51, replace "claim 1" with --claim 3 --.

In column 7, line 4, replace" claim 18" with --claim 1--.

Signed and Sealed this

Thirtieth Day of April, 1996

Attest:

BRUCE LEHMAN

Attesting Officer

Commissioner of Patents and Trademarks